United States Patent [19]
Mantell

[11] Patent Number: 5,298,771
[45] Date of Patent: Mar. 29, 1994

[54] COLOR IMAGING CHARGE-COUPLED ARRAY WITH PHOTOSENSITIVE LAYERS IN POTENTIAL WELLS

[75] Inventor: David A. Mantell, Rochester, N.Y.

[73] Assignee: Xerox Corporation, Stamford, Conn.

[21] Appl. No.: 973,811

[22] Filed: Nov. 9, 1992

[51] Int. Cl.$^5$ .................. H01L 29/161; H01L 29/78; H01L 27/14

[52] U.S. Cl. ............................ 257/183.1; 257/184; 257/231; 257/235; 257/236; 257/239; 257/440

[58] Field of Search ................ 257/183.1, 231, 235, 257/236, 239, 183, 184, 440, 446

[56] References Cited

U.S. PATENT DOCUMENTS

| | | | |
|---|---|---|---|
| 3,758,794 | 9/1973 | Kosonocky | 307/304 |
| 3,971,003 | 7/1976 | Kosonocky | 340/173 R |
| 4,383,269 | 5/1983 | Capasso | 357/30 |
| 4,432,017 | 2/1984 | Stoffel et al. | 358/213 |
| 4,613,895 | 9/1986 | Barkey et al. | 358/41 |
| 4,658,278 | 4/1987 | Elabd et al. | 357/24 |
| 4,667,213 | 5/1987 | Kosonocky | 357/24 |
| 4,696,533 | 9/1987 | Kingston et al. | 257/183.1 |
| 4,745,452 | 5/1988 | Sollner | 257/183.1 |
| 4,847,489 | 7/1989 | Dietrich | 250/226 |
| 4,975,567 | 12/1990 | Bishop et al. | 250/211 R |
| 5,010,381 | 4/1991 | Shiba | 357/30 |
| 5,105,248 | 4/1992 | Burke et al. | 257/183.1 |
| 5,138,416 | 8/1992 | Brillson | 357/30 |
| 5,185,648 | 2/1993 | Baker et al. | 257/189 |

FOREIGN PATENT DOCUMENTS 61-187282  8/1986  Japan ................... 257/440

OTHER PUBLICATIONS

J. M. Woodall and D. Shang, "Differential Phototransducer", Feb., 1970, p. 1486.

J. C. Campbell et al., "Improved Two Wavelength Demultiplexing InGaAsP Photodetector", Bell Laboratories, Holmdel, N.J. 07733.

Primary Examiner—Jerome Jackson
Assistant Examiner—Ngan Van Ngo
Attorney, Agent, or Firm—R. Hutter

[57] ABSTRACT

A multi-color imaging charge-coupled array comprises a plurality of photosensitive layers, each sensitive to a specific range of wavelengths as would be found in a full-color image. The various photosensitive layers are separated by boundary layers of high band-gap energy, so that charge packets formed within individual layers are insulated from charge packets formed in other layers within the same pixel. The combination of photosensitive layers and high band-gap boundary layers cause charge packets to be formed in potential wells within each pixel area of the charge-coupled array.

9 Claims, 2 Drawing Sheets

COLOR IMAGING CHARGE-COUPLED ARRAY WITH PHOTOSENSITIVE LAYERS IN POTENTIAL WELLS

BACKGROUND OF THE INVENTION

1. Field of the Invention

The present invention relates to a charge-coupled array (CCD) having a multi-layer structure for imaging full-color images.

2. Description of the Prior Art

Charge-coupled arrays (CCD's) are generally defined as layered structures for the selective retention of charge in specific areas thereof, wherein the structure itself may serve as a shift register for selective serial readout of data in the form of the charged areas. Discrete areas within the CCD are caused to store charge because the electrical potential is lower in the particular area holding the charge than in the surrounding material. When it is desired to read out the charges as a serial signal, the charge in each area can be transferred from one area to its neighbor by suitably changing the potential on it and its neighbors so that charge flows from one area to the next. By applying charges to a linear series of electrodes along the array, typically with some time period of overlap of charging adjacent electrodes, individual charge packets can be caused to move along the CCD. The system for transferring discrete charges from one area to the next until the charges are read out as a serial signal is colloquially known as the "bucket-brigade" method of readout. An early patent describing the shift register operation of a CCD is U.S. Pat. No. 3,758,794.

One special type of CCD is the photosensitive, or "imaging," CCD, wherein discrete areas of charge, which may be read out as serial signals, are initially created in the CCD by the imagewise focusing of light onto the structure. With certain materials, such as aluminum, gallium, and arsenic compounds and combinations in an ordered crystal structure, photons focused on the material will create electron-hole pairs in areas corresponding to the distribution of light in the image. Thus, the CCD forms a linear array of photosensors upon which narrow sections of an image can be recorded, while the CCD can output data related to the image. Such CCD's, particularly monochrome CCD's, are in common use in facsimile machines, digital copiers, and other scanners. Typical examples of such an imaging CCD are shown in U.S. Pat. Nos. 3,971,003; 4,658,278; and 4,667,213.

U.S. Pat. No. 4,383,269 discloses a photodetector (as opposed to a CCD) having an energy band structure which causes one type of charge carrier, either an electron or a proton, to ionize at a faster rate than the other type of charge carrier. The photodetector is preferably formed from semiconductors including gallium, aluminum, arsenic, and phosphides.

U.S. Pat. No. 4,432,017 discloses a high density imaging CCD having a bilinear array of photosites on a single integrated circuit chip. The photosites are offset relative to each other in two rows and coupled to a respective pair of storage registers and shift registers.

U.S. Pat. No. 4,613,895 discloses a solid state color imaging device having a plurality of regions of alternating dopant types within the material thereof. A first channel collects a first photosignal in a first region extending to a first depth of the element, and a buried channel disposed beneath the first channel collects a second photosignal in a second region extending to a depth greater than the first step. Light falling on the surface of the device penetrates the device to a wavelength-dependent depth. The color response of various portions of the device are dependent on the type and thickness of different layers of the device.

U.S. Pat. No. 4,847,489 discloses a superlattice photodetector arrangement having a plurality of photosensitive detector elements, each element having a multi-layer structure of alternating positively and negatively doped photosensitive semiconductor material. Control electrodes are arranged vertically with respect to the semiconductor layers, and adapted to receive a control voltage in order to control the spectral light sensitivity thereof.

U.S. Pat. No. 4,975,567 discloses a photodetector with a multi-layer structure, wherein different layers of the structure are sensitive to different wavelength bands, and the different layers differing by thickness. Pairs of electrical contacts are applied to each relevant semiconductor layer, and are adapted to receive associated bias voltages to enable the photosensitive layers to constitute a plurality of separate photodetectors, each having a different wavelength band.

U.S. Pat. No. 5,138,416 discloses a multi-layer color photosensitive element having different layers, each sensitive to a different primary color, and differing primarily by composition. Charge is collected from the various layers according to an amount of time for light of various colors to travel through the layers.

IBM Technical Disclosure Bulletin, Vol. 12, no. 9, page 1486, discloses a photo device having the ability to discriminate light of different wavelengths, and converting these different energies into separable electrical signals. Alternating layers of the structure either optically absorb light of a given wavelength, or lack sufficient band gap for other wavelengths, and an arrangement of these layers allows the multi-layer structure to discriminate.

The paper "Improved Two Wavelength Demultiplexing InGaAsP Photodetector" discloses various stacked layer structures to integrate both detection and demultiplexing functions in a single photodetector.

SUMMARY OF THE INVENTION

In accordance with the present invention, there is provided a photosensitive charge-coupled array, comprising a first photosensitive layer which is adapted to generate electron-hole pairs when exposed to light within a first range of wavelength. A second photosensitive layer is adapted to generate electron-hole pairs in an area thereof, when exposed to light when in a predetermined second range of wavelength which is different from the first range of wavelength. A boundary layer is disposed between the first photosensitive layer and the second photosensitive layer and is adapted to not generate electron-hole pairs when exposed to light of the first or second ranges of wavelength. Shift register means enable the shifting of image data in the photosensitive layers along a plurality of discrete areas within the array.

Also according to the present invention, there is provided a method of recording color components of an image on a photosensitive linear charge-coupled array and reading out data relating to the color components in a serial form. There is provided in the linear charge-coupled array a first layer adapted to form electron-hole pairs when exposed to light of a first wavelength, a second layer adapted to form electron-hole pairs when exposed to light of a second wavelength, and a boundary layer disposed therebetween. When the charge-coupled array is exposed, electron-hole pairs are created in the first and second layers in proportion to the components of light of the first and second wavelength along a plurality of pixels in the array. A series of shift voltages are applied to electrodes in the charge-coupled array to cause the electron-hole pairs within each pairs to migrate to one end of the charge-coupled array. At the end of the linear array, a compensatory voltage is applied for causing the electron-hole pairs within one layer associated with an individual pixel to be accessed.

DETAILED DESCRIPTION OF THE INVENTION

Figure 1:
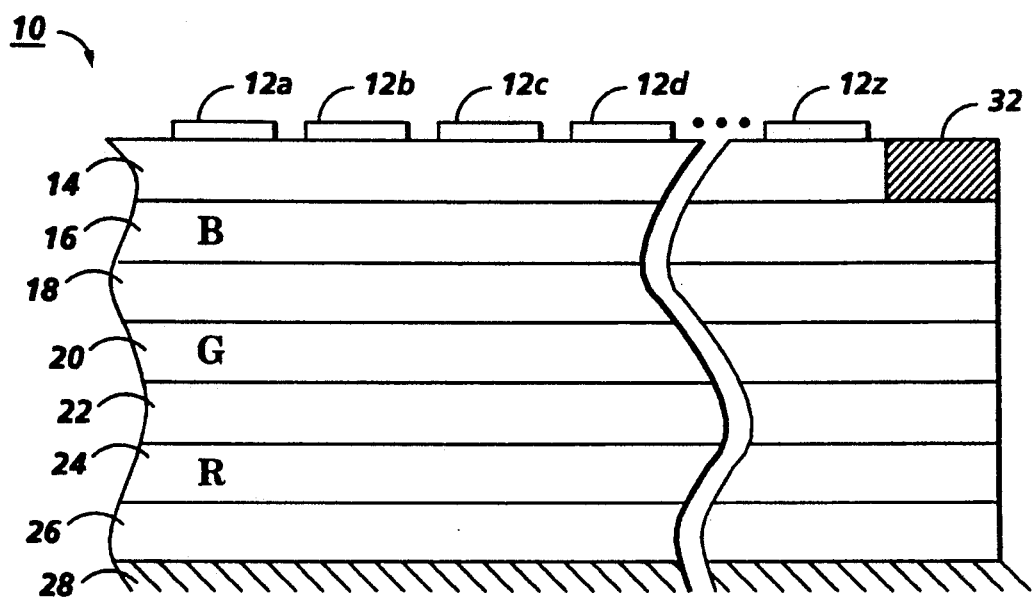
FIG. 1 is a cross-sectional, elevational view showing the layers of a linear imaging charge-coupled array according to the present invention.

FIG. 1 is a simplified cross-sectional view of a portion of the multi-layer structure of a CCD according to the present invention. Section 10 shows the area around a number of discrete locations, representing individual pixels, in a linear array CCD. Each discrete area associated with a pixel has associated therewith an electrode disposed effectively on the surface thereof, such as shown as 12a, 12b, and 12c, with a last electrode in the row indicated as 12z. These electrodes may be transparent or otherwise arranged so as not to interfere with light being exposed onto the CCD 10 from the top of the diagram, as would be apparent to one skilled in the art. The layers of the section of the CCD, from the top surface downward, are as follows: a top insulative layer 14, a blue detecting layer 16, a first large band gap boundary layer 18, a green detecting layer 20, a second large band gap boundary layer 22, a red detecting layer 24, a third large band gap layer boundary 26, and the bulk semiconductor 28 upon which all of the layers are ultimately disposed. Even though the electrodes 12a . . . 12z are disposed on an insulating layer 14, the electric fields associated with each electrode pass through the insulating layer 14 in a manner known in the art.

In an initial exposure step, such as in a facsimile machine or digital copier, the top of the CCD structure is exposed to multicolor light, as shown in FIG. 1. One pixel of image data is assigned to each electrode 12a, 12b, etc. in the array. However, it should be noted that with each pixel will be data associated with each of the three primary colors; the image data will be information regarding a relative proportion of blue signal, green signal, and red signal from the particular portion of the image creating the pixel. The exposed light will penetrate into the multi-layer structure in such a way that, for each pixel, the blue component of the light will affect blue layer 16 of the structure, the green component will affect layer 20, and the red component will affect layer 24. In photosensitive imaging CCD's, the energy associated with light will act to create specific quantities of electron-hole pairs, or "charge packets," in the photosensitive layer of the structure. Thus, the corresponding layers sensitive to individual primary colors in the multi-layer structure of CCD 10 will, upon exposure to light, be energized (that is, charge packets of a certain charge magnitude will be created) to the extent that individual primary colors are present in the light in the particular pixel. It will be noticed, in FIG. 1, that the light-sensitive layers in CCD 10 are arranged so that the layers requiring longer wavelengths of light, green and red, are respectively disposed deeper within the multi-layer structure. For this reason, short-wavelength, high energy light such as blue will be absorbed in upper layers, while longer wavelength, lower energy light will pass through these upper layers and penetrate into the multi-layer structure to a layer wherein the particular wavelength of light may cause electron-hole pairs to be created. In this way, a color separation is possible for each pixel.

Figure 2:
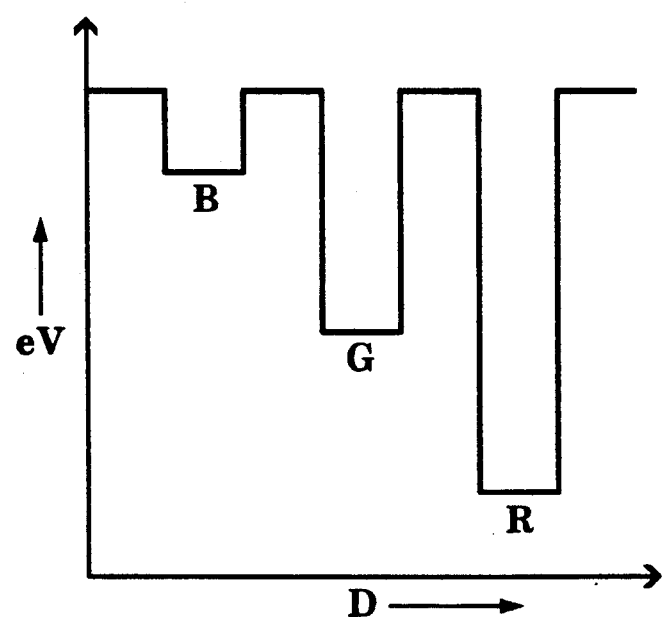
FIG. 2 is a graph showing the energy levels of various layers within the charge-coupled array as a function of depth.

FIG. 2 is a graph showing the relationship of necessary electron voltage to create electron hole pairs in various layers of the multi-layer structure of CCD 10 as a function of the depth D of the particular layer. As can be seen, predetermined electron voltages are required for the blue, green, and red levels as the depth of the structure increases. Also significant is the fact that the intervening layers of high band-gap energy within the structure, that is, boundary layers 18, 22, and 26, will not create electron-hole pairs at even the highest energy of any of the photosensitive layers 16, 20, or 24. These high-band-gap boundary layers create barriers between the various photosensitive layers, which will create electron-hole pairs at lower energies. Thus, as can be seen in FIG. 2, the photosensitive layers are disposed in, in an energy sense, "wells" so that the charge packets within each individual photosensitive layer will be electrically isolated by high band-gap layers, which border each layer on both sides thereof. The purpose of the "wells" is to prevent the creation of electron-hole pairs in any given photosensitive layer from flowing into adjacent photosensitive layers sensitive to other colors. In this way, each individual photosensitive layer in the structure may in effect operate as an independent CCD, as will be explained below.

Once the CCD has been exposed, as in part of a cycle wherein one of a series of line images forming a complete image are exposed onto the linear array of the CCD in a line-scan imager, there begins a readout step in which the charge values in each of the photosensitive layers of the CCD are read out in the familiar "bucket-brigade" fashion to form a series of signals at the end of the CCD. In the illustrated embodiment, the series of electrodes 12a, 12b, . . . 12z may be connected to an external circuit (not shown) to apply appropriate voltages to discrete areas of the array; thus the electrodes 12a, 12b, . . . 12z enable the shifting of charge packets across the array. In the case of the multicolor CCD of the present invention, each photosensitive layer will act as an independent CCD and the readout step will result in three parallel data streams, each data stream representing one color of a given pixel. This bucket-brigade technique generally consists of applying a series of potentials to the electrodes such as 12a, 12b, and 12c in a sequence so that, by decreasing the potential to one side of a given pixel, the charge packet in one particular pixel area of the CCD will move over by the length of one pixel. This process is repeated, as is known in the art, until all of the image data, in the form of discrete charge packets associated with each pixel, is read out at the end of the CCD.

In the case of the multicolor CCD of the present invention, this technique of applying voltages in sequence to various of the electrodes along the line of the CCD will, as mentioned above, result in three streams of charge packets moving in parallel across the respective layers of the CCD. That is, the stream of image data through photosensitive layer 16 will be read out as a series of the blue component of the pixels across the line, layer 20 will be the green components of each pixel, and so on. These three parallel data streams through the CCD can, in turn, be read out of the entire CCD in an order in which the color components of each pixel are read out as triplets of three charge packets each, each triplet representing the three primary color components for each pixel. This sequential readout of the pixels from the photosensitive layers in sequence may be carried out readily by applying to the CCD at the end of the linear array a series of compensatory voltages which will cause the potential high band gap barriers between the wells associated with each color in each pixel to be broken down to such an extent that the pocket of electron-hole pairs within each well can be "liberated" from the layer and to be measured and converted into a (typically digital) signal. In other words, the application of the compensatory voltage eliminates the effect of the high band gap barriers in order to access the separate charge packets within each photosensitive layer as the data is read out.

At the end of the CCD array 10 beyond the last electrode 12z is an output terminal 32, in the form of a metallic insert which is disposed as shown. The electronics necessary to provide the voltage sequence displayed in FIG. 3 and associated detection electronics may be provided elsewhere on the substrate or off the CCD structure as part of the image-processing circuitry. Output terminal 32 acts as the interface between the CCD and other electronic components which may be used to process the charge packets being read out. Typically, such components include a counter or digitizer for measuring the magnitude of individual charge packets and converting such magnitudes into digital signals. When charge packets from any layer are liberated at the end of the array 10, these charge packets will migrate to output terminal 32. The last electrode in the row, shown as electrode 12z, is used to feed in a compensatory voltage into the last pixel area of the CCD, in order to "liberate" one charge packet or another from a selected layer 16, 20, or 24, depending on the magnitude of the compensatory voltage.

Figure 3C:
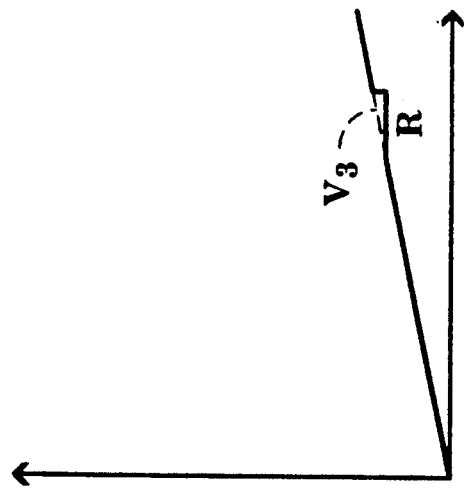
FIGS. 3A-C are a series of comparative graphs showing the effects of a compensatory voltage on the energies of various layers in the charge-coupled array in the present invention.
Figure 3B:
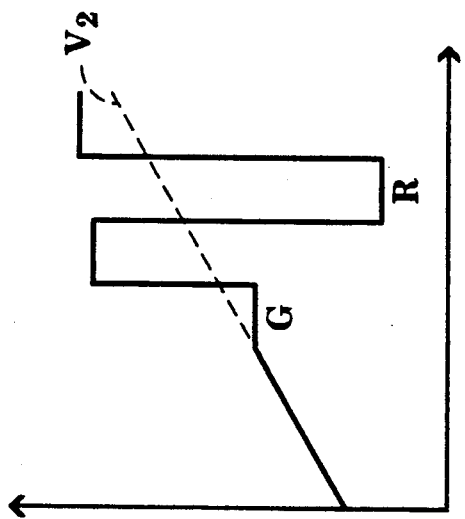
Figure 3A:
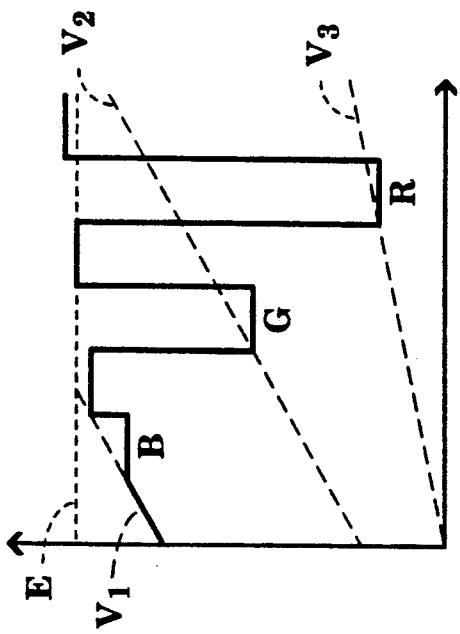

FIGS. 3A, 3B, and 3C show the effect of applying compensatory voltages, in sequence, in order to liberate the charge packets in various layers for read out. Each FIG. 3A, 3B, and 3C is the ionization potential of each layer as a function of the depth thereof in the structure, as was FIG. 2. The external application of the compensatory voltage through electrode 12z effectively lowers the barriers between the wells. In FIG. 3A, the ionization potential of the high band gap layers is shown by the dotted line marked E, which is also shown as the top of the barriers between the wells in FIG. 2. The effect of the compensatory voltages is to progressively lower these barriers by energizing high band gap layers so that the charge in each layer may "escape" in sequence to output terminal 32. In FIG. 3A is shown, in solid lines, the effect of applying a compensatory voltage $V_1$ of such magnitude that the potential barrier is, at a layer adjacent blue photosensitive layer 16, less than the potential of the electron-hole pairs in the blue photosensitive layer 16. Comparing FIG. 3A to FIG. 1, it is apparent that, with the application of compensatory voltage $V_1$, the potential in band gap layer 14 is lower than that in the blue photosensitive layer 16. For this reason, any electron-hole pairs created in photosensitive layer 16 for a given pixel will be liberated to be read out through output terminal 32, since this liberation occurs at the end of the array 10. Thus, information for the blue pixel will form, in time sequence, the first element of the triplet of pixel data for that given pixel.

FIG. 3B shows the potential of the function of depth upon the application of a second compensatory voltage $V_2$. The line $V_2$ may also be seen as the dotted line in FIG. 3A. Voltage $V_2$ will be of such a magnitude that the potential in band gap layer 18 will be less than that in photosensitive layer 20 for green components of the pixel. Because of this lower potential, the electron-hole pairs in layer 20 will be caused to escape to output terminal 32. Thus, after the application of compensatory voltage $V_2$, the electron-hole pairs relating to the green component of the pixel may be read out.

FIG. 3C shows the effect of a third compensatory voltage $V_3$ which has the effect of making the potential in band gap layer 22 lower than the potential in red photosensitive layer 24. And once again, the charge packet created in photosensitive layer 24 for a given pixel, representing the red component for that given pixel, may be read out through output terminal 32. In summary, the sequential application of stepwise higher compensatory voltages permit the electron-hole pairs for each photosensitive layer for a given pixel to be read out in an orderly fashion for measuring, and then for conversion to a digital signal for purposes of subsequent image processing. Once the first triplet of color data for a pixel is read out, the applied compensatory voltage is set to zero, the next pixel is moved to the end of the CCD, and the readout cycle begins again.

In order to create the desired structure of layers sensitive to particular desired primary colors, there are many possible direct band-gap materials available, such as $(Al_xGa_{1-x})_yIn_{1-y}As$. It is also possible to use indirect gap materials for the photosensitive layers 16, 20, and 24, such as ordered crystals of $Al_xGa_{1-x}As$. The proportion of aluminum to gallium in this ordered crystal structure (given as x) may be varied for sensitivity to a particular energy associated with a desired wavelength for a given layer. The use of indirect gap materials is possible because there is a large increase in absorption for energies at and above the material's direct gap. The small amount of absorption below the direct gap can be corrected for once the signals are read out and converted to digital form.

In brief, the best known proportions of aluminum to gallium are shown in the table below for a desired wavelength sensitivity:

| $Al_xGa_{1-x}As$ X = | Direct gap eV | λ (μm) | Color (approx.) |
| --- | --- | --- | --- |
| 0.45 | 2 | .62 | red |
| 0.6 | 2.2 | .56 | yellow |
| 0.75 | 2.4 | .52 | green |
| 0.85 | 2.6 | .48 | blue |

| $Al_xGa_{1-x}As$ X = | Direct gap eV | λ (μm) | Color (approx.) |
|---|---|---|---|
| 0.9 | 2.8 | .44 | violet |

For the boundary layers 18, 22, and 26, it is desired to provide a crystalline structure which has a considerably higher energy level than any of the photosensitive layers, as can be seen in FIG. 2. These layers of high energy are required to form the potential barriers between the respective wells which represent the photosensitive layers. The preferred material for these large band gap boundary layers is an ordered crystal of gallium phosphide (GaP). It is also significant that the variations in composition among the layers is used to facilitate discrimination by color among the layers, which in turn enables the photosensitive layers to be of substantially equal thickness. Prior art structures have relied on making various layers sensitive to different colors by varying the thickness of particular layers.

While this invention has been described in conjunction with a specific apparatus, it is evident that many alternatives, modifications, and variations will be apparent to those skilled in the art. Accordingly, it is intended to embrace all such alternatives, modifications, and variations as fall within the spirit and broad scope of the appended claims.

I claim:

1. A photosensitive charge-coupled array, defining a plurality of discrete exposable image areas in a surface thereof, comprising:
   a first photosensitive layer generating electron-hole pairs in an area thereof in response to being exposed to light within a predetermined first range of wavelength;
   a second photosensitive layer, generating electron-hole pairs in an area thereof in response to being exposed to light within a predetermined second range of wavelength different from the first range of wavelength;
   a first boundary layer disposed between the first photosensitive layer and the second photosensitive layer, having a higher band gap energy associated therewith than the first photosensitive layer and the second photosensitive layer; and
   means for enabling the shifting of image data in the first photosensitive layer and the second photosensitive layer along the discrete exposable image areas within the array.

2. A charge-coupled array as in claim 1, wherein the first photosensitive layer is disposed closer to the surface of the array than the second photosensitive layer and the first range of wavelength includes shorter wavelengths than the second range of wavelength.

3. A charge-coupled array as in claim 1, wherein the first photosensitive layer and the second photosensitive layer are of substantially the same thickness.

4. A charge-coupled array as in claim 1, wherein the first photosensitive layer and the second photosensitive layer comprise different relative proportions of aluminum and gallium.

5. A charge-coupled array as in claim 1, wherein the first photosensitive layer and the second photosensitive layer comprise aluminum, gallium, and arsenide.

6. A charge-coupled array as in claim 1, wherein the boundary layer comprises gallium phosphide.

7. A charge-coupled array as in claim 1, further comprising an electrode for applying a compensatory voltage to a portion of the array, whereby the band-gap energy of the boundary layer may be selectably decreased.

8. A charge-coupled array as in claim 1, further comprising:
   a third photosensitive layer, generating electron-hole pairs in an area thereof in response to being exposed to light within a predetermined third range of wavelength different from the first range of wavelength and the second range of wavelength; and
   a second boundary layer disposed between the first photosensitive layer and the second photosensitive layer, not generating electron-hole pairs in response to being exposed to light of the first range of wavelength, the second range of wavelength, and the third range of wavelength.

9. A charge-coupled array as in claim 8, wherein the first, second, and third photosensitive layers are respectively disposed farther from the surface of the array and are respectively sensitive to longer wavelengths of light.

* * * * *